Oct. 18, 1960 R. M. ROPPEL 2,957,104

ANALOGUE TO DIGITAL CONVERTER

Filed Dec. 18, 1956 3 Sheets-Sheet 1

INVENTOR
RICHARD M. ROPPEL

BY W R Mattox
Richard C Reed
ATTORNEYS

Oct. 18, 1960 R. M. ROPPEL 2,957,104

ANALOGUE TO DIGITAL CONVERTER

Filed Dec. 18, 1956 3 Sheets-Sheet 2

INVENTOR
RICHARD M. ROPPEL

BY W. R. M. attorney
Richard C. Reed
ATTORNEYS

Oct. 18, 1960 R. M. ROPPEL 2,957,104
ANALOGUE TO DIGITAL CONVERTER
Filed Dec. 18, 1956 3 Sheets-Sheet 3
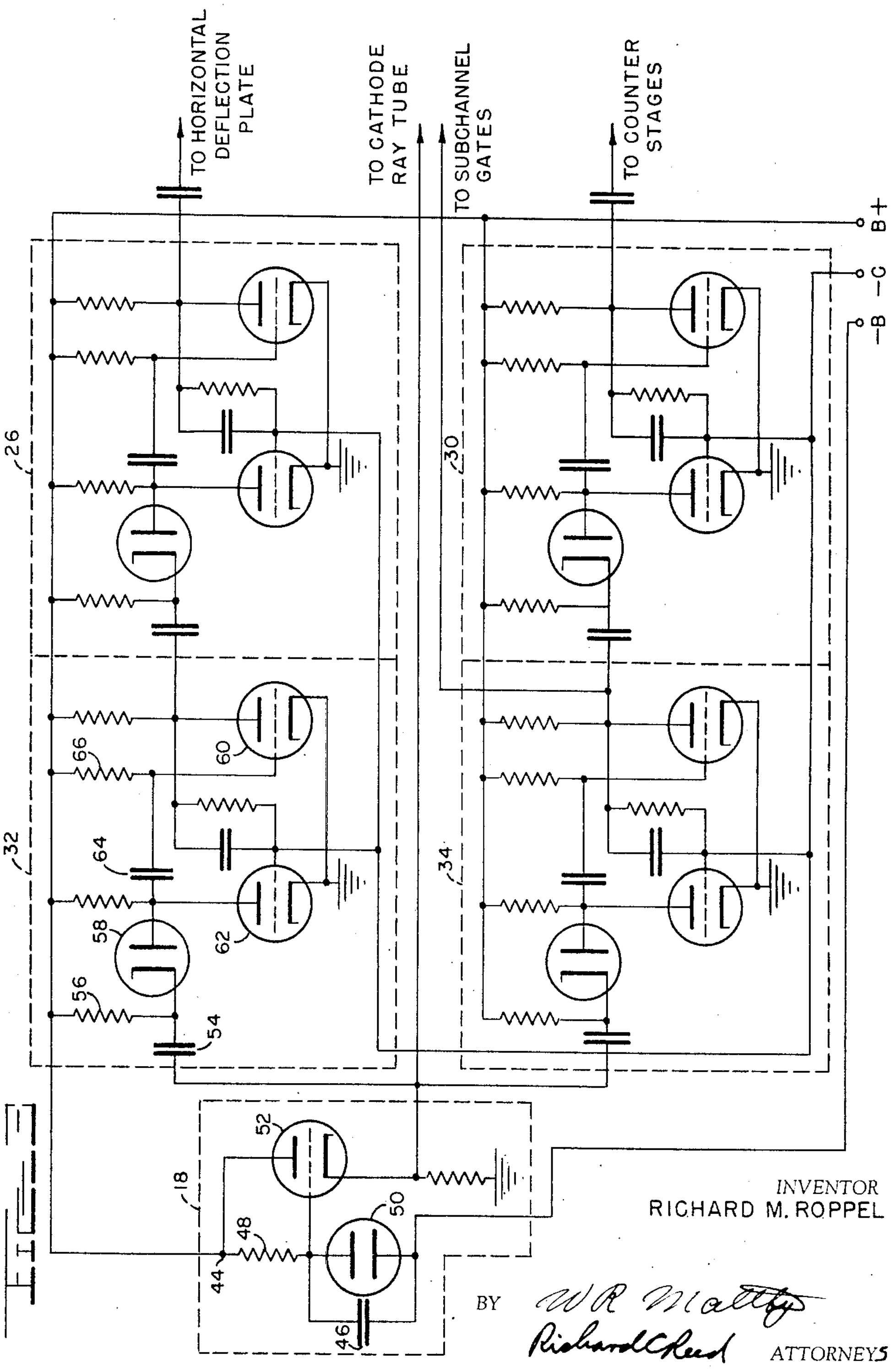
INVENTOR
RICHARD M. ROPPEL
BY W R Matthys
Richard C Reed
ATTORNEYS United States Patent Office 2,957,104

Patented Oct. 18, 1960

2,957,104

ANALOGUE TO DIGITAL CONVERTER

Richard M. Roppel, 230 Prospect St., New Haven, Conn.

Filed Dec. 18, 1956, Ser. No. 629,200

3 Claims. (Cl. 315—8.5)

(Granted under Title 35, U.S. Code (1952), sec. 266)

This invention relates, in general, to pulse code modulation and in particular to a system for converting voltage amplitude information into binary form.

A typical pulse code modulation transmission section includes an audio signal to be transmitted, a sampler which samples the audio signal at discreet time intervals, a quantizer to reduce each sampled portion of the audio signal into the nearest one of a fixed number of discreet amplitude levels, a coder to transform the amplitude of the quantized signal into a form more suitable for transmission, and an R.F. transmitter keyed by the encoded pulses for transmitting the signals over a radio or wire link. Typically, the coder output provides a pulse group occurring serially in time to represent the amplitude of each quantized pulse. This presentation of the coded signal causes a significant disadvantage at the receiving or decoding end since each sample of the audio signal at the transmitter cannot be restored to its original form in the receiver until the last pulse of its encoded pulse group has been received. Further, present day serial pulse group transmitters are incapable of handling more than about a five digit binary code and thus the number of levels used in the quantizing operation is restricted to 32. Increasing the number of levels increases the accuracy of reproduction by the system and hence is particularly desirable in pulse code systems for electronic computers.

It therefore is an object of this invention to provide a pulse encoding system producing pulse groups for parallel transmission.

It is another object of this invention to provide a pulse code modulation system producing pulse groups in a binary code of up to ten digits for either parallel or series transmission.

It is a further object of this invention to provide a pulse code modulation system having only a few components which precisely converts amplitude modulated signals into binary expressions.

It is a further object of this invention to provide a pulse code modulation system having a degree of accuracy far greater than those systems presently known in the art.

It is a further object of this invention to provide a pulse code modulation system for precisely converting amplitude modulated signals into binary expressions by means of a cathode ray device and a multi-stage binary counter.

Other objects and features of this invention will become apparent upon a careful consideration of the following description, when taken together with the accompanying drawings in which:

Figure 3 is a schematic diagram of a portion of Figure 2;

This invention, in broad terms, contemplates encoding or converting voltage amplitude information into binary form. The amplitude modulated signal is placed on a vertical deflection plate of a cathode ray tube to deflect the electron beam upwardly a distance proportional to its amplitude. Then a sweep voltage is applied to the other vertical deflection plate of the cathode ray tube and the electron beam is drawn down crossing a specially constructed target which is a series of parallel horizontal wires connected together at one end and to a multistage binary counter. Each time the beam crosses a wire of the target a pulse is generated and recorded in the counter. The beam crosses a number of wires proportional to the amplitude of the incoming signal. Thus the incoming signal is quantized by the wires into pulse groups varying in number according to the amplitude and converted into a binary code by a counter. After the electron beam has completed its sweep, a horizontal deflection voltage is applied to the electron beam to deflect it to one side of the target and at the same time the counters are read and a signal from each counter stage is sent to the appropriate subchannel for transmission as a parallel pulse group. The counters are then reset. The system is now ready for the second sampling of the signal which will cause the electron beam to rise vertically to a position representative of the amplitude sampled. Once this position has been achieved, the horizontal deflection voltage is removed and the beam is allowed to move over onto the target. The sweep voltage is now applied and the cycle is repeated. It will be understood that serial transmission may be used by converting the counter reading to a serial group of pulses.

Figure 1:
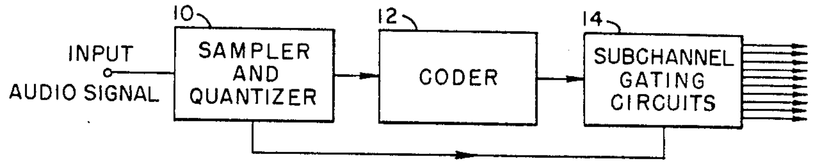
Figure 1 is a block diagram of the transmission section of one channel of a pulse code modulation system according to this invention.

Reference is now had to Figure 1 which generally discloses one intelligence transmission channel as related to units generally associated with pulse code modulation systems. According to this invention, the sampling and quantizing is a combined operation performed in block 10. The output of this block is a group of pulses for each sample of the audio signal, the number of pulses in each group being proportional to the amplitude of the sample of the audio signal. These pulse groups are fed to a coder 12 where the pulse groups are counted and transformed into binary code. The coder 12 is indicated as a ten stage binary counter having a separate subchannel gating circuit coupled to each counter stage. The ten subchannel gating circuits are indicated at 14 and have separate outputs for parallel transmission of the ten channels on radio or wire link.

Figure 2:
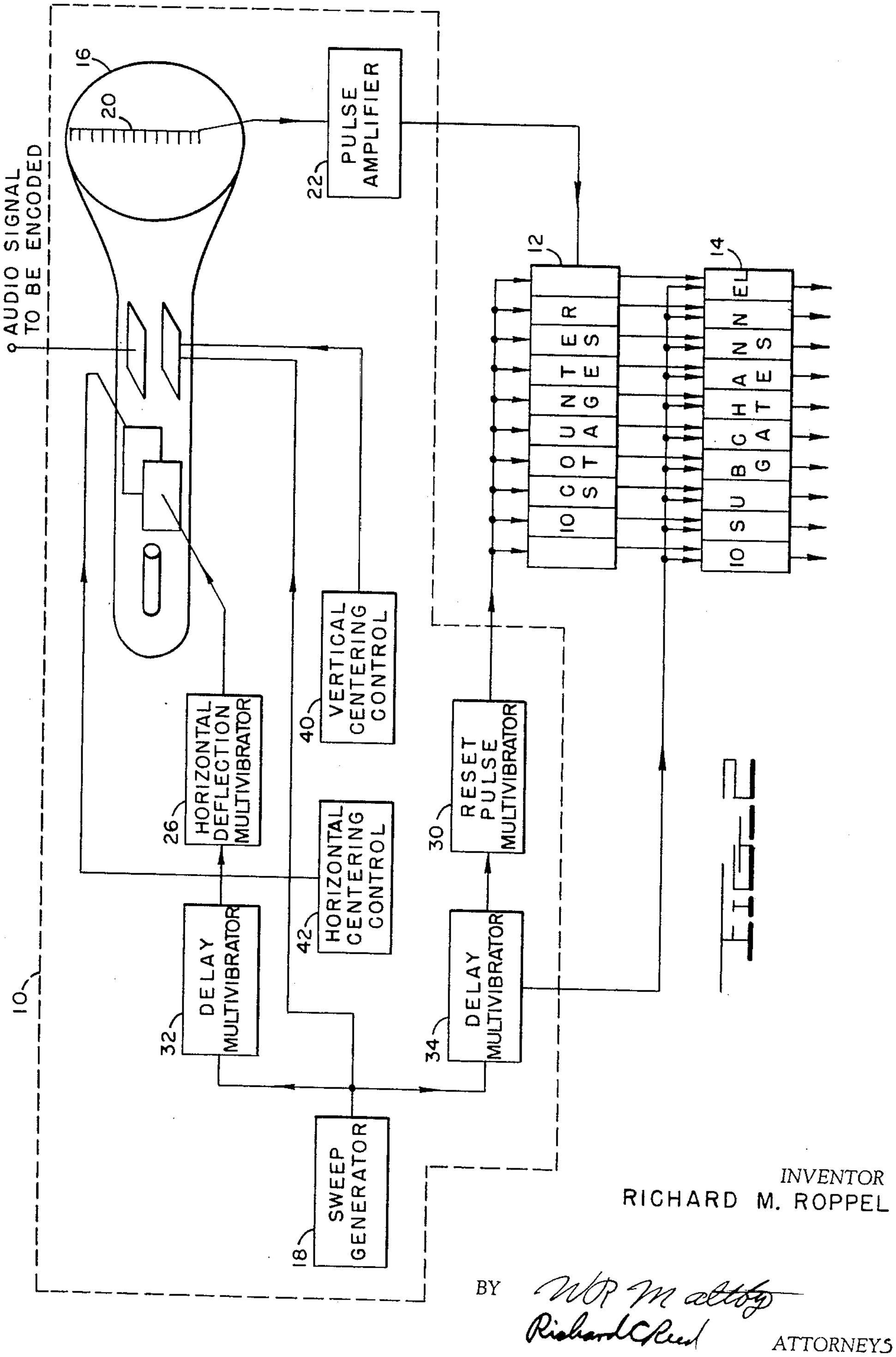
Figure 2 is a more detailed block diagram of the embodiment shown in Figure 1.

Reference is now had to Figure 2, which shows by block diagram portions of Figure 1 in greater detail. As can be seen from this figure, the system contains an electrostatically-deflected cathode ray tube 16. The incoming signal containing the voltage amplitude information is applied to the upper vertical deflection plate of tube 16 deflecting the electron beam upwardly a measured distance. By measured distance, it is meant that if the signal has an instantaneous amplitude of 30 volts the electron beam will be deflected upwardly a distance proportional to 30 volts and dependent on the deflection sensitivity of the cathode ray tube. If the signal amplitude is 40 volts the electron beam will be deflected upwardly a proportionally increased distance. Upon the lower vertical deflection plate of the cathode ray tube 16, an opposing saw-tooth voltage is impressed. This saw-tooth voltage is produced by a sweep generator 18 described in further detail in connection with Figure 3. The magnitude of the saw-tooth voltage is greater than that of the largest signal which this system is designed to handle. Therefore the saw-tooth voltage overcomes the deflection introduced by the incoming audio signal and the electron beam is deflected downwardly below its undeflected position.

Figure 5:
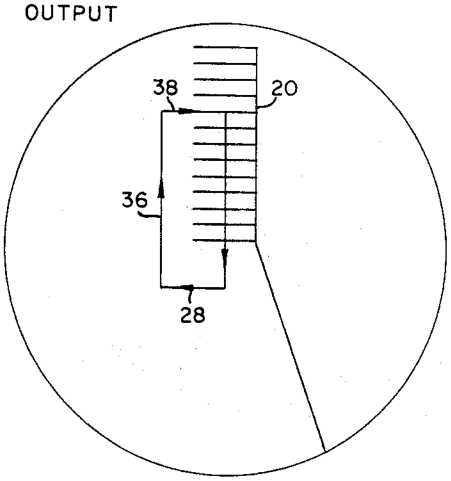
Figure 5 is an enlarged view of the face of the cathode ray tube shown in Figure 2.

The cathode ray tube 16 is a conventional electrostatically-deflected cathode ray tube having its screen modified to include a target of horizontal wires shown in greater detail in Figure 5 to which reference is now made. As can be seen from this figure, the target 20 consists of a series of equally spaced wires disposed parallel to the X axis of tube 10. Further these wires are bisected by the Y axis of the tube and are disposed above the X axis so that the undeflected beam falls just below the lowest horizontal wire. For convenience of illustration only 13 horizontal wires are shown, actually in the preferred embodiment of this invention a 10 digit code is used resulting in 1,023 horizontal wires. All of the horizontal wires of target 20 are electrically connected together at one end so that as the electron beam crosses each horizontal wire of the target a signal is produced in a common output circuit. Target 20 serves to convert the instantaneous amplitude of the input signals to the nearest of a fixed number of discreet amplitude levels and therefore may be considered as the quantizer of the system.

Referring again to Figure 2, the signals from target 20 are in pulse form and are fed to a pulse amplifier 22 where the pulses are amplified and then encoded by the multistage binary counter 12. The multistage binary counter 12, which in the preferred embodiment consists of ten Eccles-Jordan type counters is activated by the amplified pulse signals to register the signal modulation in binary form. The binary expression realized by the multistage binary counter which makes up the coder 12 shown in Figure 1 may then be fed to any type of storage device such as a magnetic drum, etc., or as shown in the preferred embodiment to ten parallel subchannels for transmission on radio or wire link for further utilization.

After the electron beam has been deflected below the target 20 by the saw-tooth voltage, a horizontal deflection voltage is applied to one horizontal deflection plate of the cathode ray tube 16. This horizontal deflection voltage is developed by the horizontal deflection multivibrator 26 in response to the downward deflection of the beam as described in detail below in connection with Figure 5. The horizontal deflection voltage will cause the electron beam to be deflected either to the left or right of the target 20 depending upon which plate of the cathode ray tube 16 it is applied. The deflection is shown by the trace 28 in Figure 5.

It should be noted at this point that if the horizontal deflection voltage is applied to the left plate of the cathode ray tube 16, the vertical wire joining the horizontal wires of target 20 together would be on the right side of these wires in order to prevent the beam from crossing this wire and giving false operation.

Shortly after the horizontal deflection voltage is applied to the cathode ray tube 16, a reset cycle is initiated for the ten stage binary counter 12. The reset pulse is generated by reset pulse multivibrator 30, Figure 2, which is also activated in response to the downward deflection of the electron beam. It should be noted at this point that the multivibrators 26 and 30 are each activated from the sweep generator 18 through delay multivibrators 32 and 34 respectively so that the horizontal deflection and the reset pulses are produced after the beam has been deflected below the target. After the reset pulse has reset the multistage binary counter 12, the system is ready to again sample the incoming signal.

The upward deflection of the electron beam caused by the amplitude of the signal and the subsidence of the downward deflecting sweep voltage is shown in Figure 5 by the trace 36. The amount of rise of the electron beam will be directly proportional to the instantaneous amplitude of the signal. After a period of time in accordance with the derived sampling rate, which is determined by the frequency of sweep generator 18, the horizontal deflection voltage will be removed and the electron beam will be allowed to swing back onto the target 20. The removal of the horizontal deflection voltage is shown by the trace 38 of the Figure 5. The system is now ready for the sweep voltage to drive the electron beam down across the target 20 and convert the second sampling of the signal into a binary expression.

It should be noted at this point that a vertical centering control 40 is also connected to the vertical deflection plates of the cathode ray tube 16. This vertical centering control 40 is used to set the undeflected position of the beam below the lowest wire of the target 20. Also connected to the cathode ray tube 16 is a horizontal centering control 42 which may be adjusted to insure that the electron beam will scan the target wires in response to the saw-tooth sweep.

Reference is now had to Figure 3 which discloses a schematic diagram for each block of the sampler and quantizer 10. As can be seen from this figure the sweep generator 18 consists of a neon tube saw-tooth generator and cathode follower. The operation of the circuit of the sweep generator 18 is as follows: B+ is applied to point 44 causing the condenser 46 to be charged through the resistance 48. The voltage across the capacitance 46 rises and at the same time the voltage across the neon tube 50 also rises since the capacitance 46 and the neon tube 50 are in parallel. The neon tube 50 acts as an open switch until the voltage across it reaches the firing point. At the firing potential, the neon tube 50 ionizes and forms a discharge path for condenser 46. The condenser 46 thus discharges very rapidly until the voltage falls to the deionization potential of the neon tube 50, when conduction stops and the tube 50 again acts as an open switch. The condenser 46 begins to charge again. The output of this circuit is fed to the grid of the cathode follower tube 52. The output of the cathode follower 52 is a saw-tooth waveform shown in waveform A of Figure 4.

As can be seen from Figures 2 and 3 this saw-tooth waveform A is fed in parallel to the lower vertical deflection plate of the cathode ray tube 16 and to the delay multivibrators 32 and 34.

Figure 4:
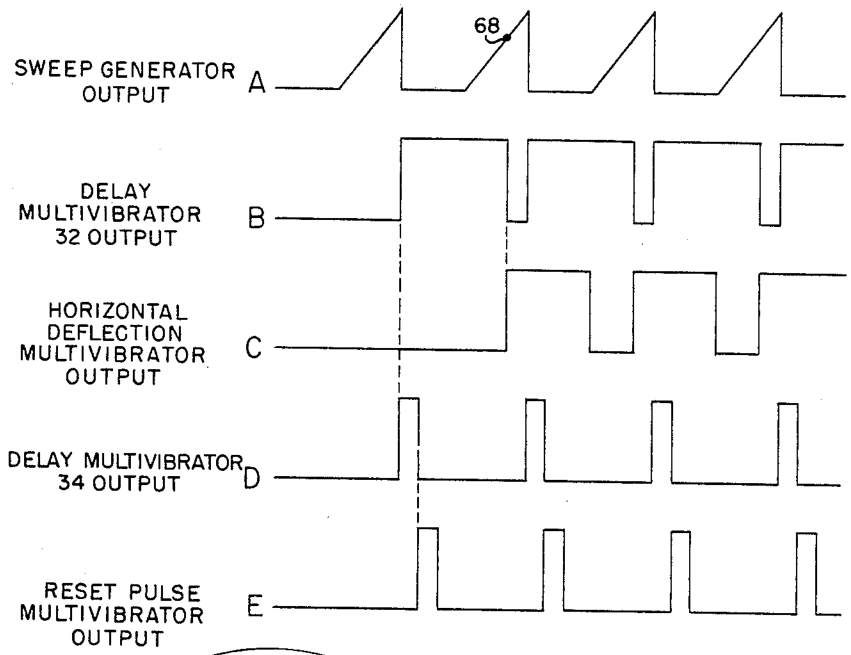
Figure 4 is a showing of voltage waveforms occurring at various points in the system shown in Figure 3.

Referring again to Figure 3, let us consider first the operation of delay multivibrator 32. This multivibrator is triggered by the falling voltage of the saw-tooth waveform A. Condenser 54 and resistance 56 of the multivibrator 32 form an R-C circuit to differentiate the saw-tooth waveform A. Diode 58 insures that only negative pulses will pass. Therefore the multivibrator 32 is triggered only by negative pulses from the differential saw-tooth. Each negative triggering pulse is coupled to the grid of triode 60 causing the plate voltage of this tube to rise. The rise of the plate voltage of tube 60 is coupled to the grid of triode 62 and the plate voltage of tube 62 will drop. The decrease in plate voltage of tube 62 is fed to the grid of tube 60 driving this tube below cutoff. Now the charge on the condenser 64 begins to leak off and the voltage on the grid of tube 60 begins to rise toward cutoff. The plate voltage of tube 60 remains constant until the grid voltage rises above cutoff at which point the plate voltage begins to fall. Thus it can be seen that the delay multivibrator 32 is triggered by the fall of the sweep voltage waveform A and has a positive rectangular waveform output at the plate of tube 60. Further it should be noted that the duration or duty cycle of the output pulse is determined by the condenser 64 and the resistance 66. The output pulse of delay multivibrator 32 is shown in Figure 4 as waveform B. As can be seen from this figure the duration of this pulse is such that at a point of time indicated at 68 of waveform A the multivibrator regenerates to its quiescent or stable state.

The delay multivibrator 32 in turn triggers the horizontal deflection multivibrator 26. The circuitry of the horizontal deflection multivibrator 26 is the same as that of the delay multivibrator 32 with appropriate values for the condenser 64 and the resistance 66. The horizontal deflection multivibrator 26 generates the waveform C of Figure 4. This waveform C is applied to one of the horizontal deflection plates of the cathode ray tube 16 to deflect the electron beam in a manner shown by the trace 28 of Figure 5. Thus it can be seen that point 68 represents the maximum voltage the system can encode. The waveform A shows that the saw-tooth generator 18 generates a sweep which is prolonged slightly above this point in order to sweep the full length of target 20 to insure that the horizontal deflection voltage has time to move the electron beam clear of the target 20 before the fall of the saw-tooth voltage. As can be seen from a comparison of waveforms A and C of Figure 4 the deflection voltage generated by the multivibrator 26 is terminated before the saw-tooth waveform A of the sweep generator 18 begins to rise. This insures that the electron beam is on the target 20 just before the saw-tooth voltage A is applied to the cathode ray tube 16.

The saw-tooth waveform A generated by the sweep generator 18 of Figures 2 and 3 is also fed to the delay multi vibrator 34. The delay multivibrator 34 whose circuitry is exactly the same as that of the delay multivibrator 32 is also triggered by the falling voltage of the saw-tooth waveform A. This is clearly shown in Figure 4. The output of the delay multivibrator 34 is the waveform D of Figure 4. This output pulse of the multivibrator 34 triggers the reset pulse multivibrator 30. The output of the reset pulse multivibrator 30 is shown by waveform E of Figure 4. This multivibrator 30 also has the same circuitry as the delay multivibrator 32 with different appropriate values again for the condenser 64 and the resistance 66.

The counter 12 of Figure 1 has Eccles-Jordan flip-flop or counter circuits. Since the operation of these counters are old and well known and fully disclosed in applicant's copending application Serial No. 277,890 filed March 21, 1952, no further description of them is thought to be necessary.

The output of the ten stage binary counter 12, as shown in Figures 1 and 2, is arranged for parallel transmission. This is accomplished by providing one output path for each stage of the counter. Further, each output path is provided with a subchannel reading gate, see Figure 2, which reads the counter 12. These subchannel reading gates are controlled by and synchronized with the output of delay multivibrator 34. As can be seen from Figure 4, the output of delay multivibrator 34 is a rectangular pulse shown in waveform D. The gates are opened as the output voltage of multivibrator 34 rises. The gating circuits remain open until the output voltage of multivibrator 34 begins to fall, thus insuring that there will be no false reading of the counter 12. Also it can be seen from Figure 4 that as soon as the subchannel reading gates are closed the reset multivibrator 30 generates a reset pulse to clear the counter 12.

Thus it can be seen that the preferred embodiment of the invention may be used to encode an audio signal for a pulse code modulation system such as used in telephony. Furthermore, since the parallel output from the counter permits simultaneous utilization of the binary information produced in each stage of the counter, this system is particularly desirable for high speed electronic computer applications. For this latter purpose, it may be desirable to feed the output subchannels directly to utilization circuits or to storage devices such as magnetic drums.

From the foregoing description of the present invention, it is apparent that considerable modification of the features thereof is possible without exceeding the scope of the invention which is defined in the appended claims.

The invention described herein may be manufactured and used by or for the Government of the United States of America for governmental purposes without the payment of any royalties thereon or therefor.

What is claimed is:

1. An encoding system capable of expressing a signal voltage amplitude in binary form comprising, a cathode ray device having an electron beam, horizontal and vertical deflection plates and a plurality of target elements comprising a plurality of closely spaced parallel wires connected together at one end and open at the other, a pulse amplifier connected to said parallel wires to deliver a pulse each time and element of the target is crossed by said electron beam, an input terminal for an amplitude modulated signal whose instantaneous amplitude is to be measured, said input terminal being directly connected to one of said vertical deflection plates to deflect said beam upwardly alongside the open ends of said target wires a distance proportional to the amplitude of the voltage to be measured, a periodic sweep generator connected to the other vertical deflection plate to sweep said electron beam across the target elements to generate a series of pulses in number proportional to the instantaneous signal voltage amplitude, a multistage binary counter connected to said pulse amplifier to count said pulses, and a rectangular pulse generator triggered by said sweep generator and connected to a horizontal deflection plate to horizontally deflect said electron beam onto said target during the period of said sweep, whereby a count of a number of pulses proportional to the instantaneous amplitude of said voltage is obtained for each sweep of said sweep generator.

2. An encoding system capable of expressing a signal voltage amplitude in binary form comprising, a cathode ray device having an electron beam, horizontal and vertical deflection plates and a plurality of target elements comprising a plurality of closely spaced parallel wires connected together at one end and open at the other, a pulse amplifier connected to said parallel wires to deliver a pulse each time an element of the target is crossed by said beam, an input terminal for an amplitude modulated signal whose instantaneous amplitude is to be measured, said input terminal being directly connected to one of said vertical deflection plates to deflect said beam upward alongside the open ends of said target wires a distance proportional to the amplitude of the voltage to be measured, a periodic sweep generator connected to the other vertical deflection plate to sweep said beam across said target elements to generate a series of pulses in number proportional to the instantaneous signal voltage amplitude, a multistage binary counter connected to said pulse amplifier to count said pulses, a plurality of gating circuits operated in synchronism by said sweep generator and connected to said counter to read each stage of said counter simultaneously, means triggered by said sweep generator to reset said binary counter after the counter has been read, and a rectangular pulse generator triggered by said sweep generator and connected to a horizontal deflection plate to horizontally deflect said electron beam onto said target during the period of said sweep, whereby a erading in binary form of the instantaneous amplitude of said voltage is obtained for each sweep of said sweep generator.

3. A voltage amplitude measuring system comprising a cathode ray device having horizontal and vertical deflection plates and a plurality of target elements comprising a plurality of closely spaced parallel wires connected together at one end and open at the other, a pulse amplifier connected to said parallel wires to deliver a pulse each time an element of the target is crossed by the electron beam, an input terminal for an amplitude modulated signal whose instantaneous amplitude is to be measured, said input terminal being directly connected to one of said vertical deflection plates to deflect said beam upward alongside the open ends of said target wires a distance proportional to the amplitude of the voltage to be measured, a periodic sweep generator connected to the other vertical deflection plate to sweep the beam across a number of target elements proportional to the voltage amplitude, and a rectangular pulse generator triggered by said sweep generator to horizontally deflect said electron beam onto said target elements during the period of said sweep, whereby a number of pulses proportional to the instantaneous amplitude of said voltage are generated by said target elements for each sweep of said sweep generator.

References Cited in the file of this patent

UNITED STATES PATENTS

| | | |
|---|---|---|
| 2,441,296 | Snyder | May 11, 1948 |
| 2,474,266 | Lyons | June 28, 1949 |
| 2,474,811 | Arditi | July 5, 1949 |
| 2,525,077 | Morton | Oct. 10, 1950 |
| 2,560,585 | McMillan | July 17, 1951 |
| 2,568,449 | Hansen | Sept. 18, 1951 |
| 2,576,029 | Mohr | Nov. 20, 1951 |
| 2,576,948 | Le Roy | Dec. 4, 1951 |
| 2,616,060 | Goodall | Oct. 28, 1952 |
| 2,640,983 | Stokes et al. | June 2, 1953 |
| 2,712,038 | Carver | June 28, 1955 |
| 2,733,358 | Carapellotti | Jan. 31, 1956 |
| 2,745,985 | Lewis | May 15, 1956 |
| 2,769,164 | Cunningham | Oct. 30, 1956 |
| 2,791,697 | Dell | May 7, 1957 |
| 2,791,764 | Gray | May 7, 1957 |
| 2,837,639 | Gray | June 3, 1958 |
| 2,881,416 | Hosken | Apr. 7, 1959 |